(12) United States Patent
Do et al.

(10) Patent No.: US 8,476,772 B2
(45) Date of Patent: Jul. 2, 2013

(54) SEMICONDUCTOR DEVICE AND METHOD OF FORMING BASE SUBSTRATE WITH RECESSES FOR CAPTURING BUMPED SEMICONDUCTOR DIE

(75) Inventors: Byung Tai Do, Singapore (SG); Arnel Trasporto, Singapore (SG); Linda Pei Ee Chua, Singapore (SG); Reza A. Pagaila, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 261 days.

(21) Appl. No.: 12/953,812

(22) Filed: Nov. 24, 2010

(65) Prior Publication Data

US 2012/0126429 A1    May 24, 2012

(51) Int. Cl.
  *H01L 23/48* (2006.01)
(52) U.S. Cl.
  USPC ............... 257/777; 257/E23.031; 257/676; 438/106
(58) Field of Classification Search
  USPC ............... 257/777, 676, E23.031; 438/106
  See application file for complete search history.

(56) References Cited

U.S. PATENT DOCUMENTS

| | | | |
|---|---|---|---|
| 6,689,640 B1 * | 2/2004 | Mostafazadeh | 438/121 |
| 2002/0195720 A1 * | 12/2002 | Miyazaki | 257/778 |
| 2004/0084757 A1 | 5/2004 | Seo | |
| 2006/0125113 A1 * | 6/2006 | Liu et al. | 257/778 |
| 2007/0170559 A1 | 7/2007 | Camacho et al. | |
| 2010/0224971 A1 * | 9/2010 | Li | 257/676 |
| 2010/0258920 A1 * | 10/2010 | Chien et al. | 257/666 |

* cited by examiner

*Primary Examiner* — Robert Huber
*Assistant Examiner* — Matthew Gordon
(74) *Attorney, Agent, or Firm* — Robert D. Atkins; Patent Law Group: Atkins & Associates, P.C.

(57) ABSTRACT

A semiconductor device has a base substrate with recesses formed in a first surface of the base substrate. A first conductive layer is formed over the first surface and into the recesses. A second conductive layer is formed over a second surface of the base substrate. A first semiconductor die is mounted to the base substrate with bumps partially disposed within the recesses over the first conductive layer. A second semiconductor die is mounted to the first semiconductor die. Bond wires are formed between the second semiconductor die and the first conductive layer over the first surface of the base substrate. An encapsulant is deposited over the first and second semiconductor die and base substrate. A portion of the base substrate is removed from the second surface between the second conductive layer down to the recesses to form electrically isolated base leads for the bumps and bond wires.

28 Claims, 11 Drawing Sheets

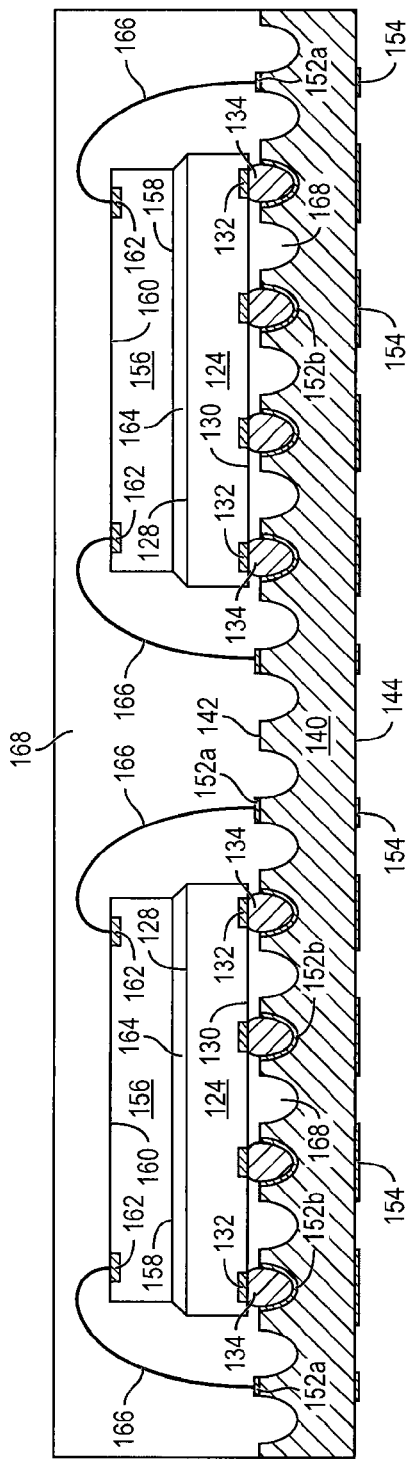
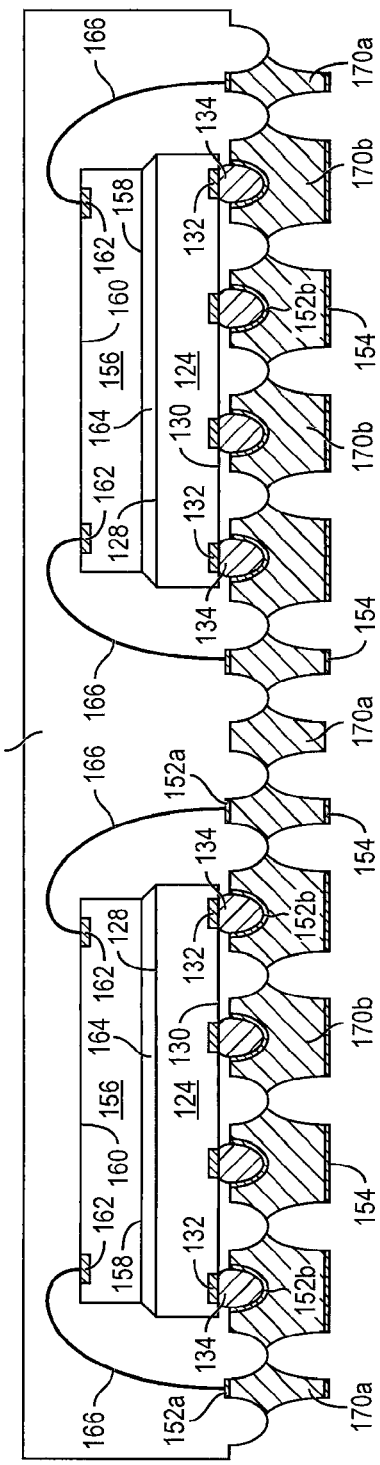

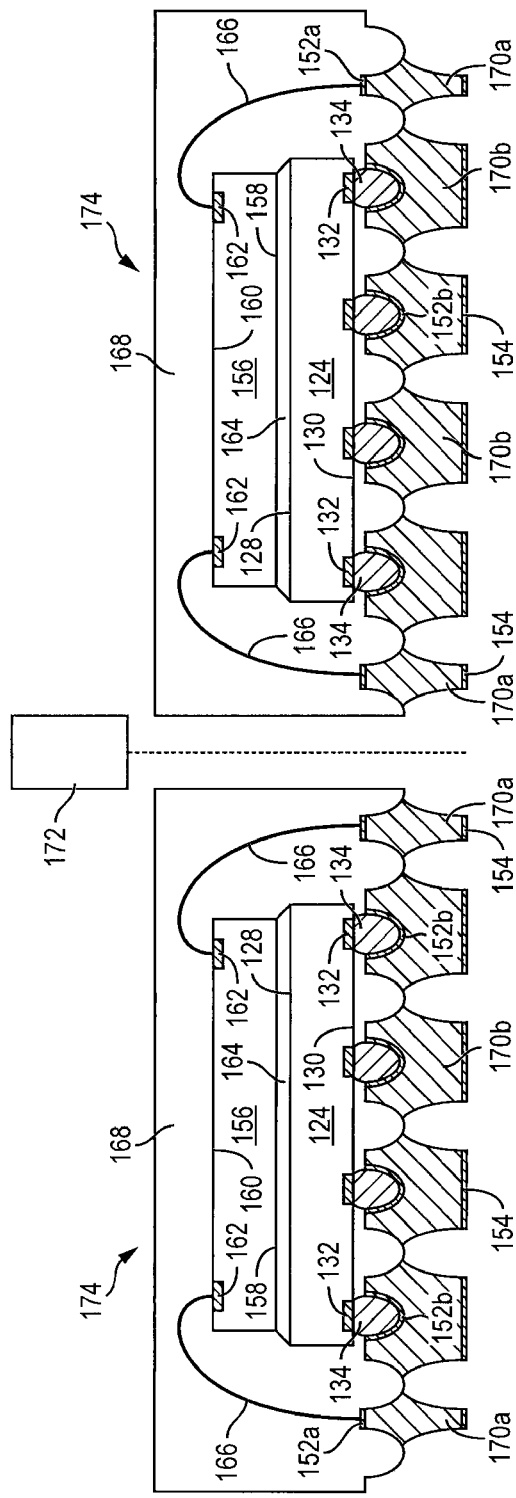
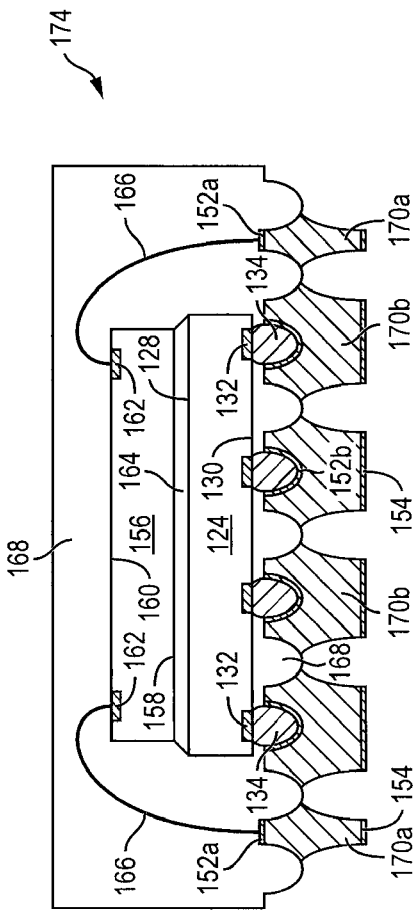
FIG. 4m
FIG. 5

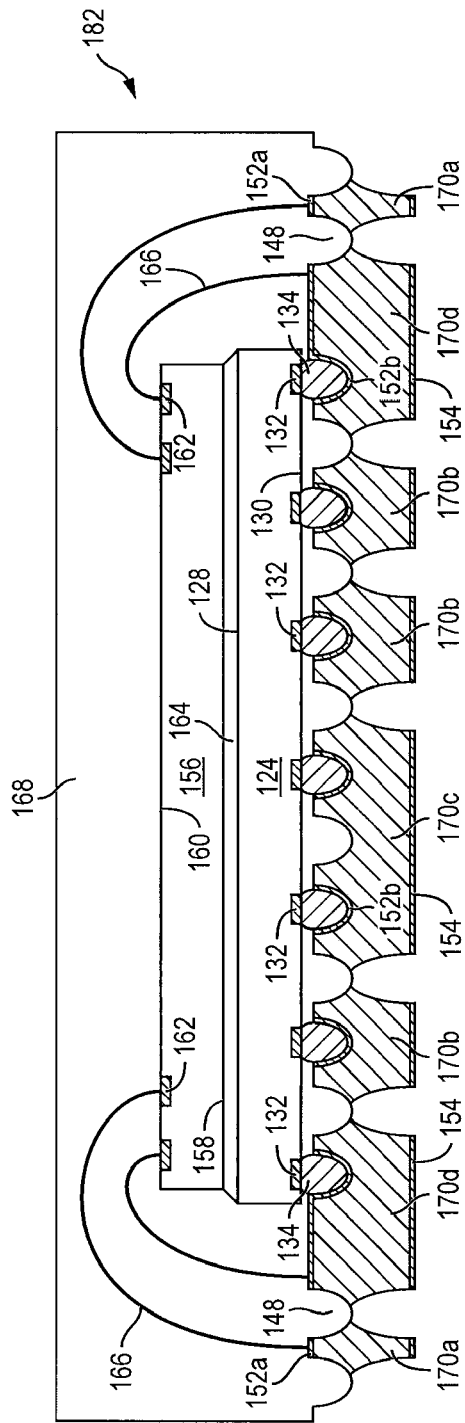
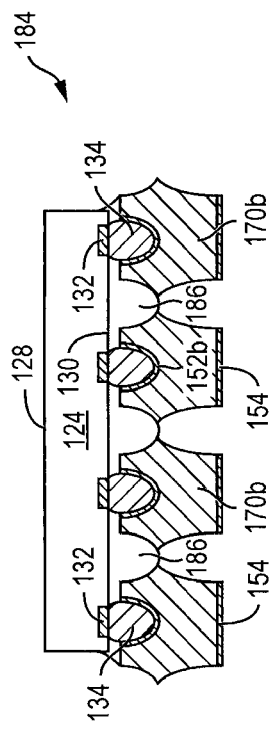
FIG. 8
FIG. 9

SEMICONDUCTOR DEVICE AND METHOD OF FORMING BASE SUBSTRATE WITH RECESSES FOR CAPTURING BUMPED SEMICONDUCTOR DIE

FIELD OF THE INVENTION

The present invention relates in general to semiconductor devices and, more particularly, to a semiconductor device and method of forming a base substrate with recesses for capturing a bumped semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials.

Semiconductor devices are often stacked or mounted to a substrate for efficient integration. The electrical interconnection between semiconductor device and substrate, e.g., bump interconnect, is known to detach or delaminate under thermal or mechanical stress. The prior art has used several different techniques to make the electrical interconnect more robust. For example, the bumps can be reflowed or pressed into a contact pad to form a mechanical bond. However, the bond strength is limited to the shear strength between the surfaces of the mechanical bond. In addition, the bump material tends to laterally spread during bonding which can cause electrical shorting to adjacent structures. The potential for lateral spreading of bump material restricts bump pitch and input/output (I/O) count.

SUMMARY OF THE INVENTION

A need exists for a semiconductor with a robust interconnect structure while reducing lateral spreading of bump material during bonding. Accordingly, in one embodiment, the present invention is a method of making a semiconductor device comprising the steps of providing a base substrate having first and second opposing surfaces, forming a plurality of recesses in the first surface of the base substrate, forming a first conductive layer over the first surface of the base substrate and into a first portion of the recesses, forming a second conductive layer over the second surface of the base substrate, providing a first semiconductor die having a plurality of bumps formed over an active surface of the first semiconductor die, mounting the first semiconductor die to the base substrate with the bumps partially disposed within the recesses over the first conductive layer, mounting a second semiconductor die to the first semiconductor die, forming a plurality of bond wires between the second semiconductor die and the first conductive layer over the first surface of the base substrate, depositing an encapsulant over the first and second semiconductor die and base substrate, and removing a portion of the base substrate from the second surface between the second conductive layer down to the recesses to form electrically isolated base leads for the bumps and bond wires.

In another embodiment, the present invention is a method of making a semiconductor device comprising the steps of providing a base substrate, forming a plurality of recesses in a first surface of the base substrate, forming a first conductive layer into a first portion of the recesses, forming a second conductive layer over a second surface of the base substrate opposite the first surface, providing a first semiconductor die having a plurality of bumps formed over a surface of the first semiconductor die, mounting the first semiconductor die to the base substrate with the bumps partially disposed within the recesses over the first conductive layer, depositing an encapsulant over the first semiconductor die and base substrate, and removing a portion of the base substrate from the second surface between the second conductive layer down to the recesses to form electrically isolated base leads for the bumps.

In another embodiment, the present invention is a method of making a semiconductor device comprising the steps of providing a base substrate, forming a plurality of recesses in a first surface of the base substrate, forming a first conductive layer over a second surface of the base substrate opposite the first surface, mounting a first semiconductor die to the base substrate with an interconnect structure partially disposed within the recesses, depositing an encapsulant between the first semiconductor die and base substrate, and removing a portion of the base substrate between the second conductive layer down to the recesses to form electrically isolated base leads for the interconnect structure.

In another embodiment, the present invention is a semiconductor device comprising a base substrate having a plurality of recesses formed in a first surface of the base substrate. A first conductive layer is formed over a second surface of the base substrate opposite the first surface. A first semiconductor die is mounted to the base substrate with an interconnect structure partially disposed within the recesses. An encapsulant is deposited between the first semiconductor die and base substrate. A portion of the base substrate between the second conductive layer is removed down to the recesses to form electrically isolated base leads for the interconnect structure.

BRIEF DESCRIPTION OF THE DRAWINGS

FIGS. 4a-4m illustrate a process of forming a wafer-level base substrate with recesses for capturing a bumped semiconductor die;

FIG. 5 illustrates the semiconductor die with bumps locked into recesses of base substrate;

FIG. 8 illustrates the base substrate with base leads commonly connecting bumps and bond wires; and FIG. 9 illustrates a mold underfill between the semiconductor die and base substrate.

DETAILED DESCRIPTION OF THE DRAWINGS

Figure 1:
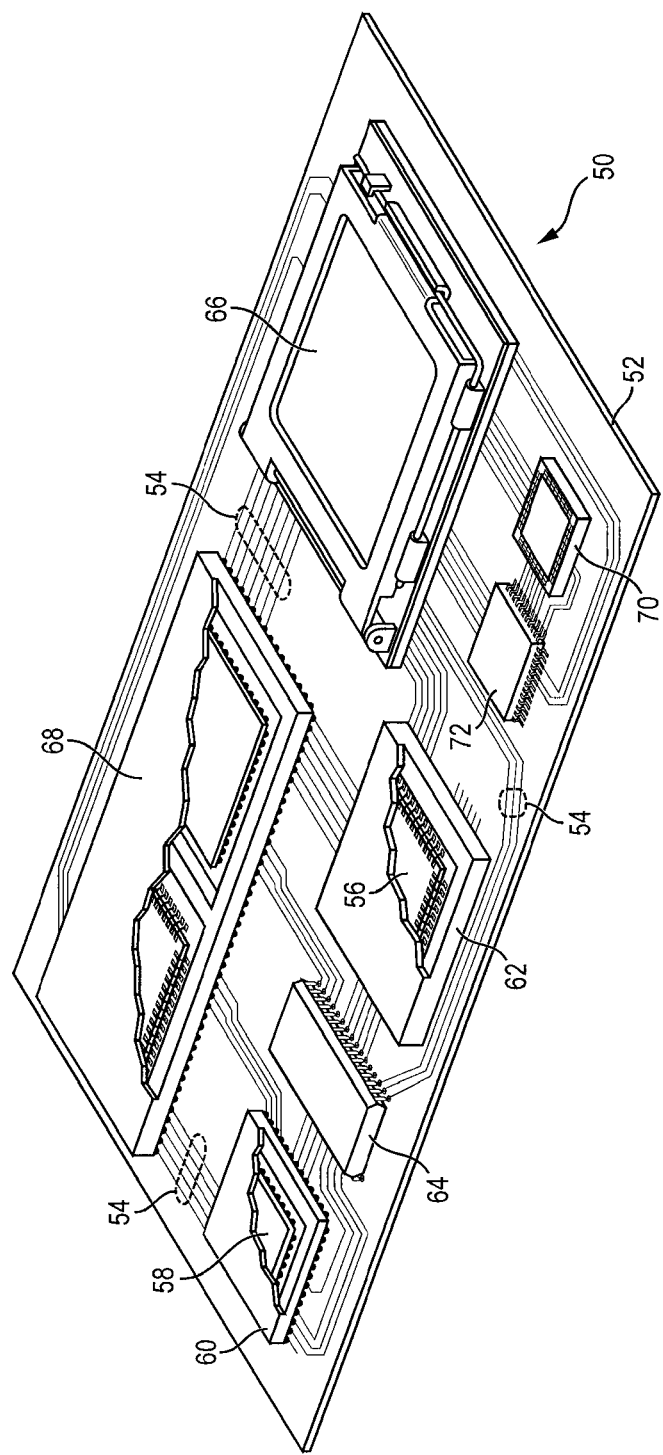
FIG. 1 illustrates a PCB with different types of packages mounted over its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
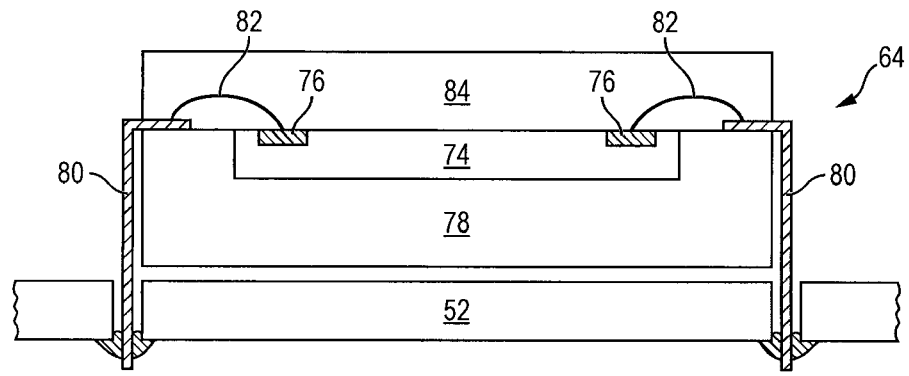
FIGS. 2a-2c illustrate further detail of the semiconductor packages mounted over the PCB.
Figure 2B:
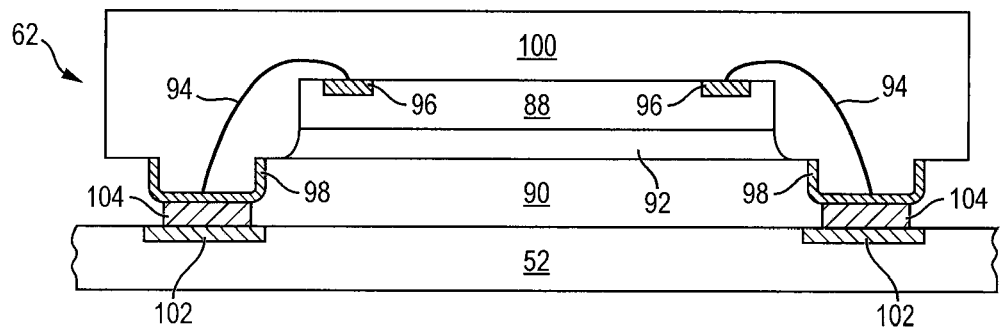
Figure 2C:
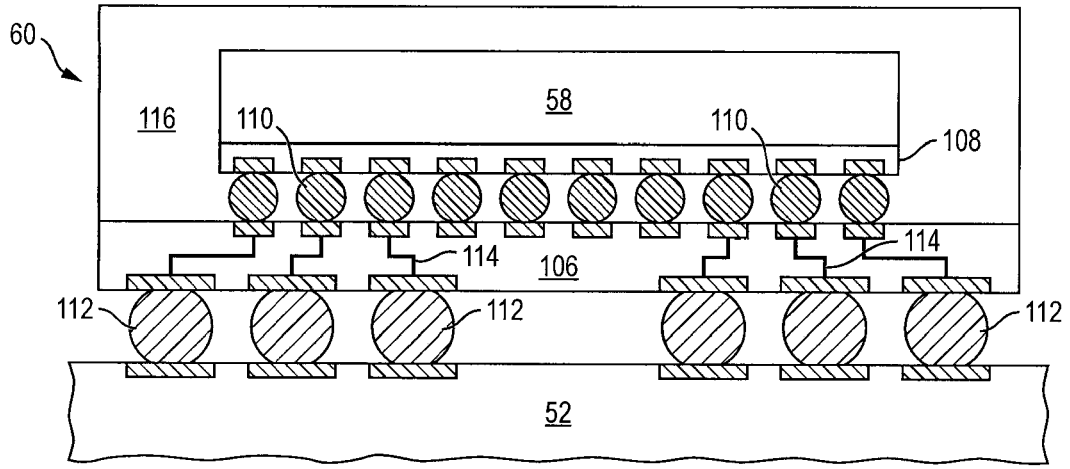

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
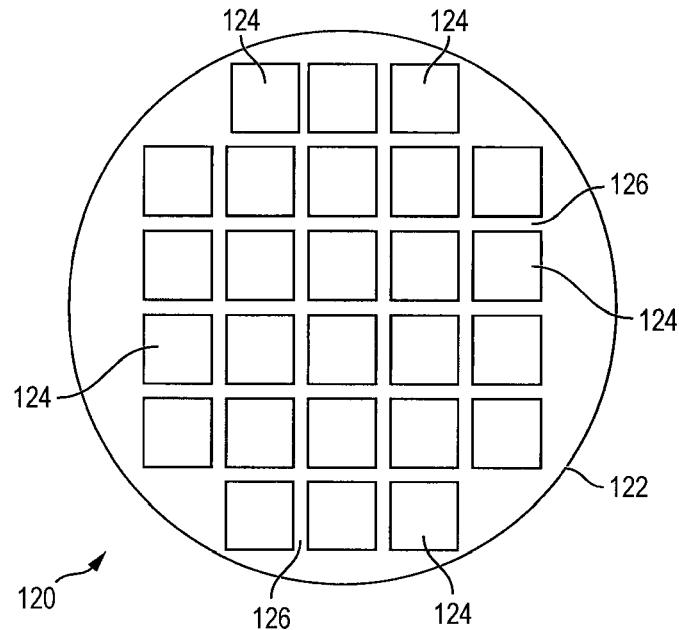
FIGS. 3a-3c illustrate a semiconductor wafer with a plurality of semiconductor die separated by saw streets.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126, as described above.

Figure 3B:
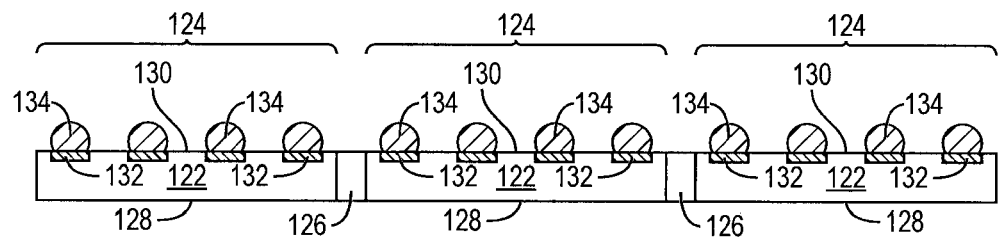

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit can include one or more transistors, diodes, and other circuit elements formed within active surface 130 to implement analog circuits or digital circuits, such as digital signal processor (DSP), ASIC, memory, or other signal processing circuit. Semiconductor die 124 can also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Bumps 134 are formed on contact pads 132. In one embodiment, semiconductor die 124 is a flipchip type semiconductor die.

Figure 3C:
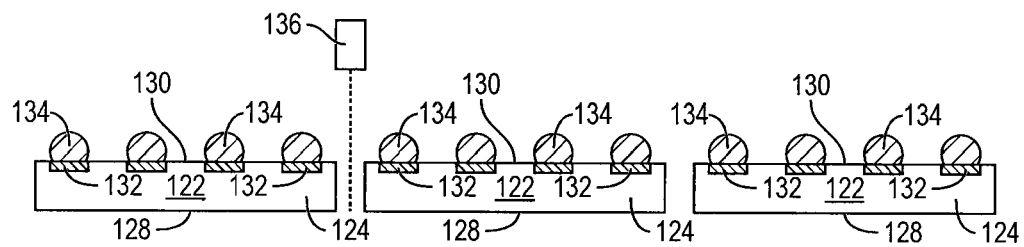

In FIG. 3c, semiconductor wafer 120 is singulated through saw street 126 using saw blade or laser cutting tool 136 into individual semiconductor die 124. Each semiconductor die 124 has bumps 134 formed over contact pads 132.

Figure 4A:
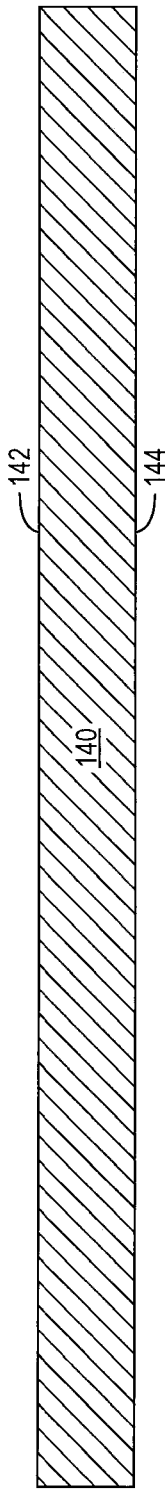

FIGS. 4a-4m illustrate, in relation to FIGS. 1 and 2a-2c, a process of forming a wafer-level base substrate with recesses for capturing a bumped semiconductor die. FIG. 4a shows a portion of wafer-level base substrate or leadframe 140 containing Cu, Cu alloys, Al, or other suitable conductive material. Base substrate 140 has surface 142 and opposite surface 144. Wafer-level base substrate 140 has sufficient area to process multiple semiconductor die, as described below.

Figure 4B:
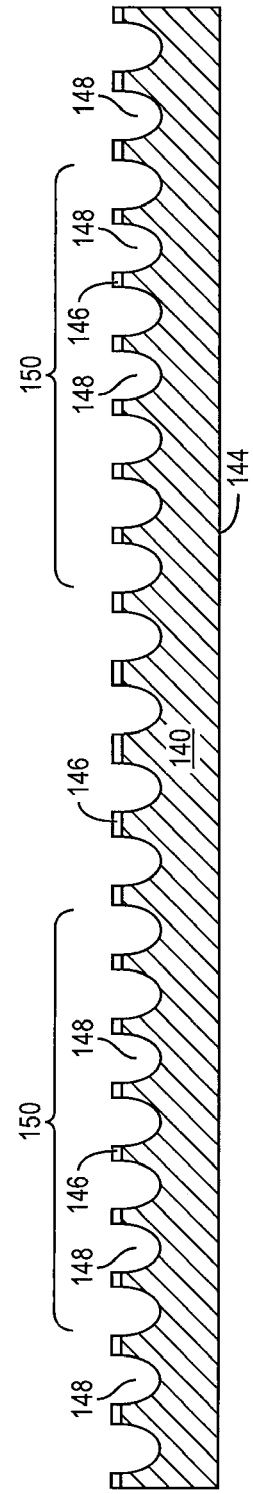

In FIG. 4b, a masking layer 146 is formed over surface 142. A plurality of cavities or recesses 148 is formed from surface 142 partially through base substrate 140 using electronic discharge machining (EDM), alkalized isotropic wet etching, or laser cutting. In one embodiment, recesses 148 have a width of 0.107 millimeters (mm) with bump pitch of about 0.214 mm. Die attach area 150 is designated as shown for later mounted semiconductor die 124.

Figure 4C:
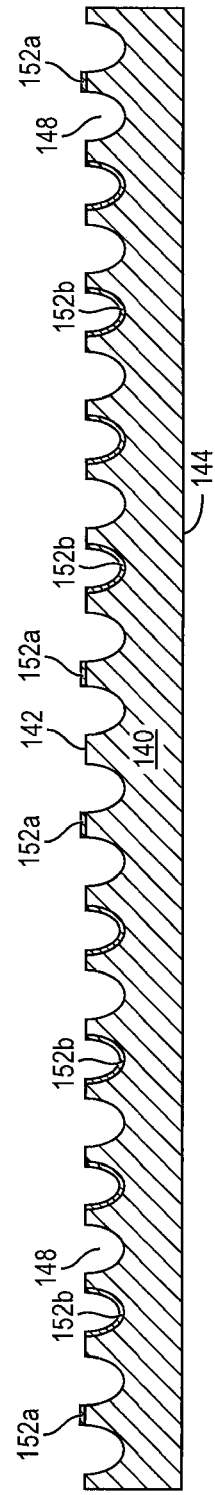

In FIG. 4c, masking layer 146 is removed and an electrically conductive layer 152 is formed over surface 142 of base substrate 140 and into a portion of recesses 148 using patterning and an electrolytic plating or electroless plating process. Conductive layer 152a is formed over alternating portions of surface 142 between recesses 148 outside die attach area 150 and operates as contact pads for later formed bond wires. Conductive layer 152b is formed within alternating recesses 148 inside die attach area 150 and operates as contact pads for bumps 134 of later mounted semiconductor die 124.

Figure 4D:
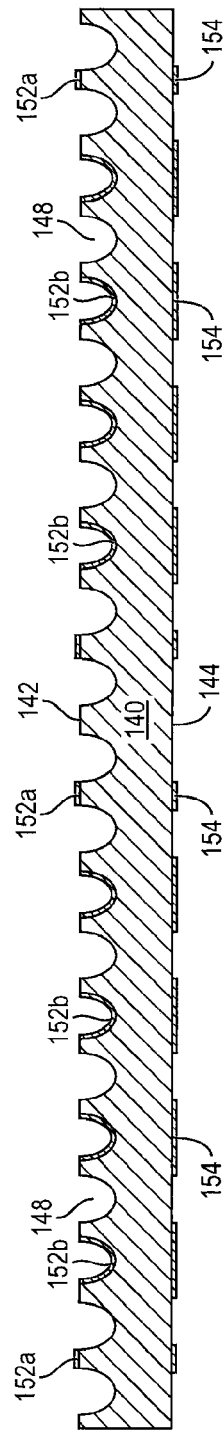

In FIG. 4d, an electrically conductive layer 154 is formed over surface 144 of base substrate 140 using patterning and an electrolytic plating or electroless plating process. Conductive layers 152 and 154 can be one or more layers of Al, Cu, Sn, Ni, Au, Ag, or other suitable electrically conductive material. In one embodiment, conductive layers 152 and 154 are Ag or Au on a preplated leadframe (Ag/PPF plating).

Figure 4E:
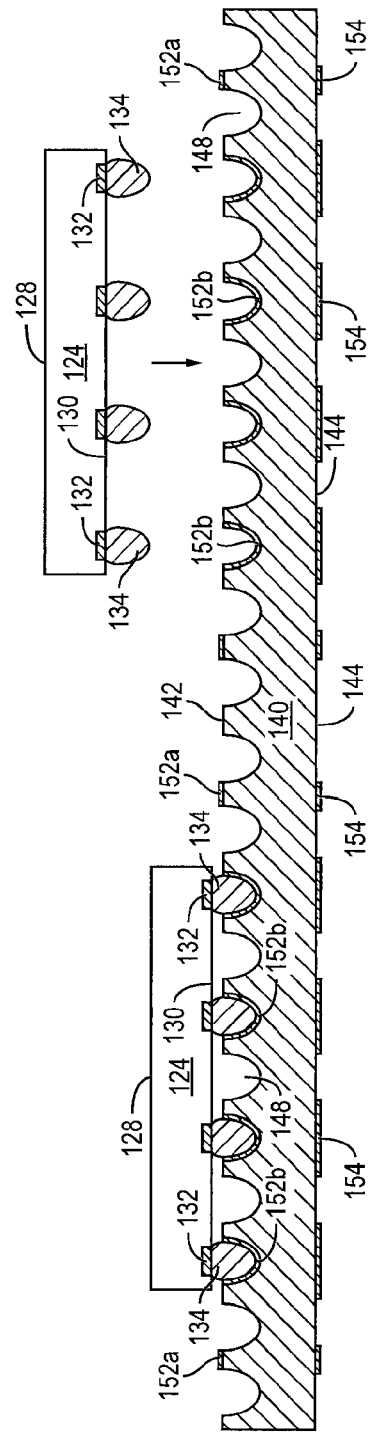
Figure 4F:
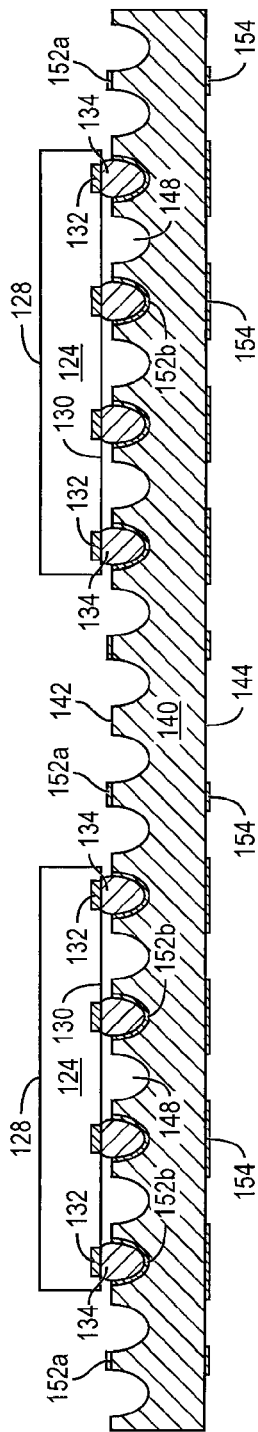

In FIG. 4e, semiconductor die 124 from FIGS. 3a-3c are positioned over and mounted to conductive layer 152b using a pick and place operation. Recesses 148 aid with alignment of bumps 134 and semiconductor die 124. Bumps 134 are metallurgically and electrically connected to conductive layer 152b by reflow and pressure. A force can be applied to back surface 128 of semiconductor die 124 to assist with inserting the bump material into recesses 148. The requisite force to engage bumps 134 within recesses 148 can be achieved in a vacuum. In the case of stud bumps, thermo-compression bonding can be used to engage the bumps within recesses 148. Bumps 134 are partially contained within recesses 148 and mechanically locked to achieve a robust interconnect. FIG. 4f shows semiconductor die 124 mounted to base substrate 140.

Figure 4G:
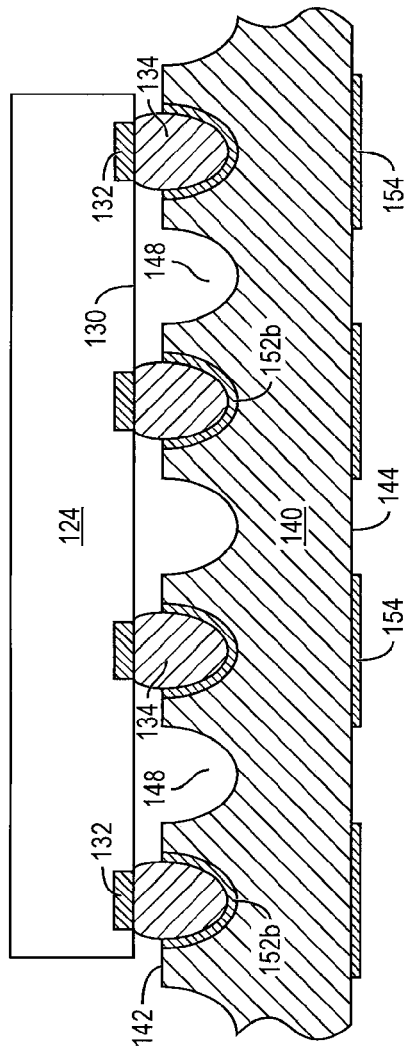

FIG. 4g shows further detail of a portion of semiconductor die 124 and base substrate 140 with bump 134 bonded to conductive layer 152b and mechanically locked within recess 148. By mounting and bonding bump 134 partially within recess 148, any lateral expansion of the bump is restricted. A portion of bump 134 may expand slightly onto surface 142 on either side of recess 148, i.e., due to wetting, but the bump expansion is primarily vertical and contained with recess 148. The limited lateral expansion of bump material permits bump pitch to be reduced and I/O count to increase. The potential for electrical shorting to adjacent bumps is also reduced. The empty recess 148 between bumps 134, later filled with encapsulant, further minimizes the risk of electrical shorting between adjacent bumps.

Figure 4H:
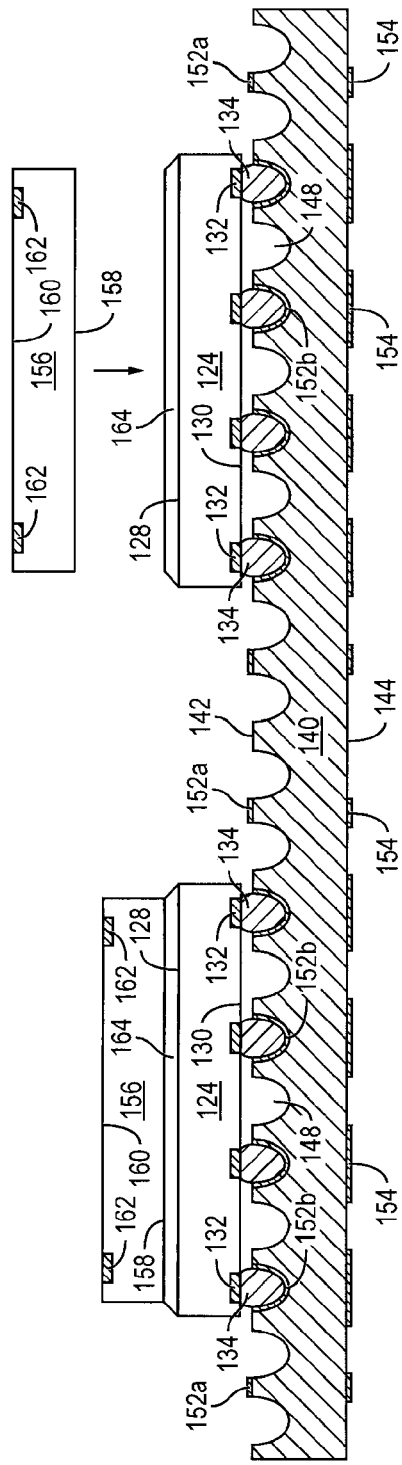

FIG. 4h shows semiconductor die 156 with back surface 158 and active surface 160 containing analog or digital circuits implemented as active devices, passive devices, conductive layers, and dielectric layers formed within the die and electrically interconnected according to the electrical design and function of the die. For example, the circuit can include one or more transistors, diodes, and other circuit elements formed within active surface 160 to implement analog circuits or digital circuits, such as DSP, ASIC, memory, or other signal processing circuit. Semiconductor die 156 can also contain IPDs, such as inductors, capacitors, and resistors, for RF signal processing. Contact pad 162 is formed on active surface 160. In one embodiment, semiconductor die 156 is a wire bond type semiconductor die.

Figure 4I:
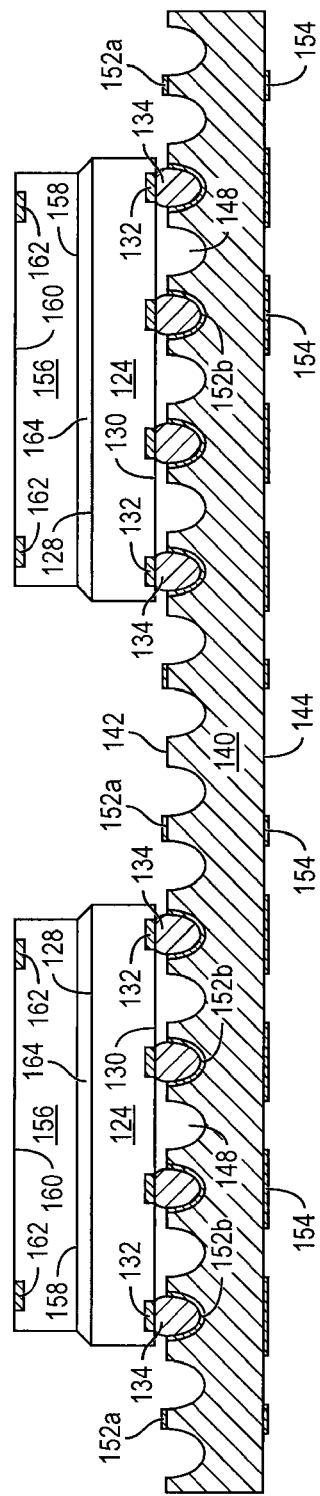

Semiconductor die 156 are mounted back surface 158 to back surface 128 of semiconductor die 124 using die attach adhesive 164, such as epoxy resin. FIG. 4i shows semiconductor die 156 mounted back-surface to back-surface with semiconductor die 124.

Figure 4J:
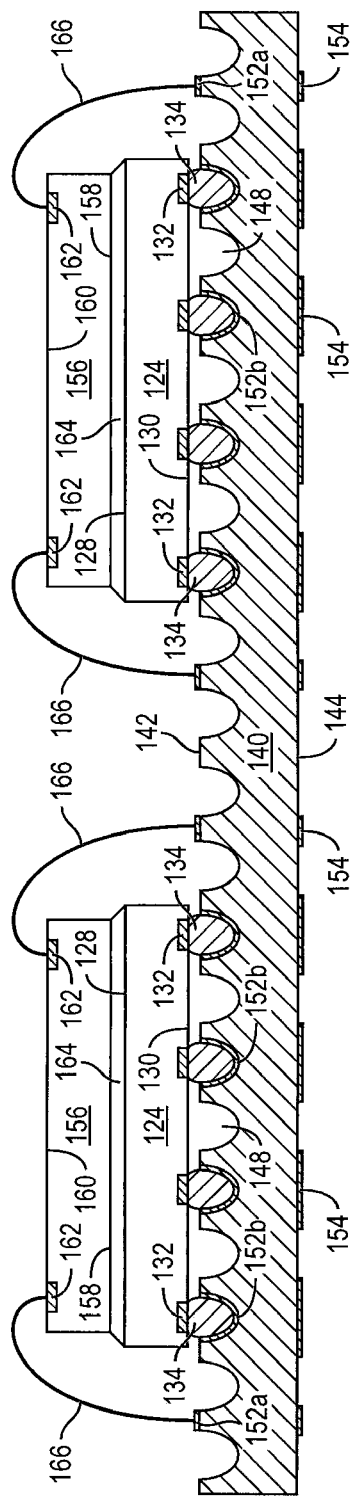

In FIG. 4j, bond wires 166 are formed between contact pads 162 of semiconductor die 156 and conductive layer 152a of base substrate 140, which resides on surface 142 outside die attach area 150 and outside recesses 148.

In FIG. 4k, an encapsulant or molding compound 168 is deposited over semiconductor die 124 and 156 and base substrate 140, between semiconductor die 124 and base substrate 140, and into the empty recesses 148 between adjacent bumps 134, using a paste printing, compressive molding, transfer molding, liquid encapsulant molding, vacuum lamination, spin coating, or other suitable applicator. In one embodiment, encapsulant 168 is deposited between semiconductor die 124 and base substrate 140 and into the empty recesses 148 between adjacent bumps 134 with mold underfill (MUF) process. Semiconductor die 124 and 156 and base substrate 140 are placed in mold chase and encapsulant material is injected into one side with optional vacuum assist from the opposite side. Encapsulant 168 is uniformly distributed around bumps 134 between semiconductor die 124 and base substrate 140, including into the empty recesses 148 between adjacent bumps 134. Encapsulant 168 can be polymer composite material, such as epoxy resin with filler, epoxy acrylate with filler, or polymer with proper filler. Encapsulant 168 is non-conductive and environmentally protects the semiconductor device from external elements and contaminants.

In FIG. 4*l*, a portion of base substrate 140 between segments of conductive layer 154 is removed from surface 144 using an etching process, such as alkalized isotropic wet etching, to separate and form electrically isolated base leads 170*a* and 170*b* as multiple rows of vertical structures defined by the post-etching areas of base substrate 140. The Ag/PPF plating nature of conductive layer 154 is resistant to the etching process. The etchant reacts more aggressively in removing material within base substrate 140 than with conductive layer 154. Consequently, the portion of base substrate 140 between segments of conductive layer 154 is removed because there are no opposing conductive layers 152 and 154. On the other hand, the portion of base substrate 140 between opposing conductive layers 152 and 154, i.e., base leads 170*a*-170*b*, as well as conductive layers 152 and 154, remain intact following the etching process due to the etch-resistant nature of the conductive layers. The patterning of conductive layer 154 determines the configuration of z-direction vertical base leads 170*a*-170*b*. Base leads 170*a*-170*b* provide vertical electrical connection for semiconductor die 124 and 156.

In FIG. 4*m*, wafer-level base substrate 140 is singulated through encapsulant 168 using saw blade or laser cutting tool 172 to separate the semiconductor die and provide individual embedded wafer-level ball grid array (eWLB), wafer-level chip scale package (WLCSP), and quad flat pack no-load (QFN) semiconductor packages 174 for further integration.

FIG. 5 shows semiconductor package 174 after singulation. Semiconductor die 124 and 156 are electrically connected through bond wires 166 and bumps 134 to base leads 170*a* and 170*b*, respectively. By mounting and bonding bumps 134 partially within recesses 148, any lateral expansion of the bumps is restricted. That is, bump expansion is primarily vertical further into recesses 148. The limited lateral expansion of bump material, shown in detail in FIG. 4*g*, permits bump pitch to be reduced and I/O count to increase. The potential for electrical shorting to adjacent bumps is also reduced. The encapsulant-filled recesses 148 between bumps 134 further minimizes the risk of electrical shorting between adjacent bumps. With bumps 134 partially contained within recesses 148, the height of semiconductor package 174 is reduced. In addition, recesses 148 mechanically lock bumps 134 for a robust interconnect which reduces lateral movement and die shifting, particularly during encapsulation.

Figure 6:
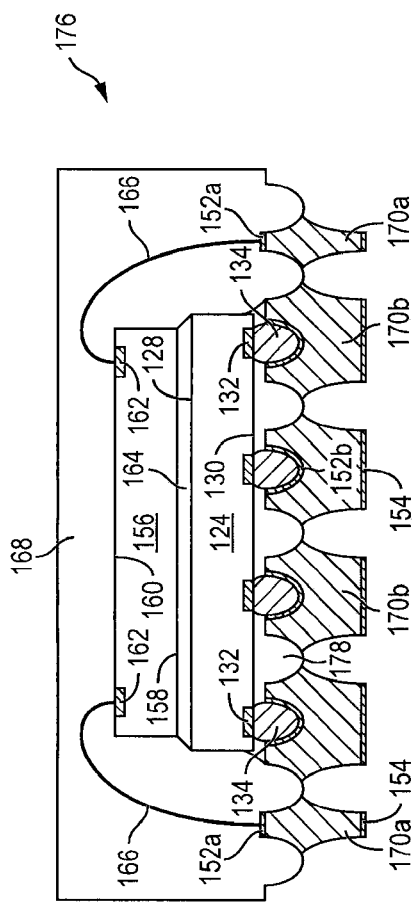
FIG. 6 illustrates an underfill material between the semiconductor die and base substrate.

FIG. 6 shows an embodiment of semiconductor package 176, similar to FIG. 5, with underfill material 178, e.g., epoxy resin, deposited between semiconductor die 124 and base substrate 140 prior to over encapsulation of FIG. 4*k*.

Figure 7:
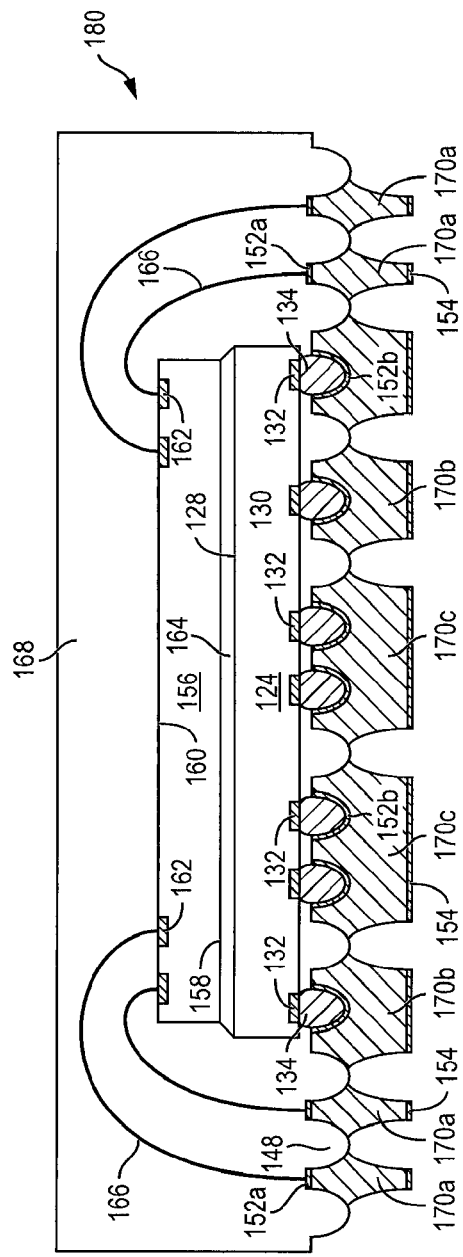
FIG. 7 illustrates the base substrate with base leads commonly connecting bumps.

FIG. 7 shows an embodiment of semiconductor package 180, similar to FIG. 5, with modified base leads 170*a*-170*c*. More specifically, base leads 170*c* electrically connect adjacent bumps 134. The base lead 170*c* commonly connecting bumps 134 are useful for power and ground connections. The contact pads for base leads 170*c* can be linear, circular, or islands. The configuration of base leads 170*a*-170*c* are determined by formation of conductive layer 154, as described in FIG. 4*d*.

FIG. 8 shows an embodiment of semiconductor package 182, similar to FIG. 5, with modified base leads 170*a*-170*d*. More specifically, base leads 170*c* electrically connect adjacent bumps 134 and base leads 170*d* electrically connect bumps 134 and bond wires 166. Base leads 170*d* are useful to provide electrical connection between semiconductor die 124 and 156. The configuration of base leads 170*a*-170*d* are determined by formation of conductive layer 154, as described in FIG. 4*d*.

FIG. 9 shows an embodiment of semiconductor package 184 with semiconductor die 124 mounted to base substrate 140. An encapsulant 186 is deposited between semiconductor die 124 and base substrate 140 with MUF process. Semiconductor die 124 and base substrate 140 are placed in mold chase and encapsulant material is injected into one side with optional vacuum assist from the opposite side. Encapsulant 186 is uniformly distributed around bumps 134 between semiconductor die 124 and base substrate 140, including into the empty recesses 148 between adjacent bumps 134.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a base substrate including first and second opposing surfaces
   and a plurality of recesses formed in the first surface of the base substrate;
   forming a first conductive layer over the first surface of the base substrate and into first recesses of the plurality of recesses;
   forming a second conductive layer over the second surface of the base substrate opposite the first recesses;
   providing a first semiconductor die including a plurality of bumps formed over a surface of the first semiconductor die;
   disposing the first semiconductor die over the base substrate with the bumps partially disposed within the first recesses over the first conductive layer;
   depositing an encapsulant over the first semiconductor die and base substrate; and
   removing a portion of the base substrate from the second surface between the second conductive layer down to second recesses between the first recesses while retaining a portion of the base substrate to form electrically isolated base leads for the bumps.

2. The method of claim 1, further including restricting lateral spread of the bumps by partially disposing the bumps within the first recesses.

3. The method of claim 1, further including depositing an underfill material between the first semiconductor die and base substrate prior to depositing the encapsulant.

4. The method of claim 1, wherein the base leads commonly connect adjacent bumps.

5. The method of claim 1, further including:
   disposing a second semiconductor die over the first semiconductor die; and
   forming a plurality of bond wires between the second semiconductor die and the first conductive layer over the first surface of the base substrate.

6. The method of claim 5, wherein the base leads commonly connect the bumps and bond wires.

7. The method of claim 1, further including depositing the encapsulant between the first semiconductor die and base substrate and into third recesses of the plurality of recesses.

8. A method of making a semiconductor device, comprising:
   providing a base substrate
   including a plurality of recesses formed in a first surface of the base substrate;
   forming a first conductive layer into first recesses of the plurality of recesses;

forming a second conductive layer over a second surface of the base substrate opposite the first recesses;

providing a first semiconductor die including a plurality of bumps formed over a surface of the first semiconductor die;

disposing the first semiconductor die over the base substrate with the bumps partially disposed within the first recesses over the first conductive layer; and removing a portion of the base substrate from the second surface between the second conductive layer down to second recesses of the plurality of recesses while retaining a portion of the base substrate to form electrically isolated base leads for the bumps.

9. The method of claim 8, further including:
disposing a second semiconductor die over the first semiconductor die; and
depositing an encapsulant over the first and second semiconductor die and base substrate.

10. The method of claim 8, further including restricting lateral spread of the bumps by partially disposing the bumps within the first recesses.

11. The method of claim 8, further including depositing an underfill material between the first semiconductor die and base substrate.

12. The method of claim 8, wherein the base leads commonly connect adjacent bumps.

13. The method of claim 8, further including depositing an encapsulant between the first semiconductor die and base substrate and into third recesses of the plurality of recesses.

14. The method of claim 8, further including depositing an encapsulant over the first semiconductor die and base substrate.

15. A method of making a semiconductor device, comprising:
providing a base substrate including a plurality of recesses formed in a first surface of the base substrate;
forming a first conductive layer over a second surface of the base substrate opposite first recesses of the plurality of recesses;
disposing a first semiconductor die over the base substrate with an interconnect structure partially disposed within the first recesses; and
removing a portion of the base substrate between the first conductive layer down to second recesses of the plurality of recesses while retaining a portion of the base substrate to form electrically isolated base leads for the interconnect structure.

16. The method of claim 15, further including forming a second conductive layer into the first recesses.

17. The method of claim 15, further including:
disposing a second semiconductor die over the first semiconductor die; and
depositing an encapsulant over the first and second semiconductor die and base substrate.

18. The method of claim 15, further including restricting lateral spread of the interconnect structure by partially disposing the interconnect structure within the first recesses.

19. The method of claim 15, further including depositing an underfill material between the first semiconductor die and base substrate.

20. The method of claim 15, further including depositing an encapsulant between the first semiconductor die and base substrate and into third recesses of the plurality of recesses.

21. The method of claim 15, further including depositing an encapsulant over the first semiconductor die and base substrate.

22. A method of making a semiconductor device, comprising:
providing a substrate including a plurality of recesses formed in a first surface of the substrate;
disposing a first semiconductor die over the substrate with an interconnect structure partially disposed within alternating recesses; and
removing a portion of the substrate down to recesses between the alternating recesses while retaining a portion of the substrate to form electrically isolated base leads.

23. The method of claim 21, further including depositing an encapsulant over the first semiconductor die and substrate.

24. The method of claim 21, further including forming a conductive layer over a second surface of the substrate opposite the alternating recesses.

25. The method of claim 21, further including forming a conductive layer into the alternating recesses.

26. The method of claim 21, further including:
disposing a second semiconductor die over the first semiconductor die; and
depositing an encapsulant over the first and second semiconductor die and substrate.

27. The method of claim 21, further including restricting lateral spread of the interconnect structure by partially disposing the interconnect structure within the alternating recesses.

28. The method of claim 21, further including depositing an underfill material between the first semiconductor die and substrate.

* * * * *

UNITED STATES PATENT AND TRADEMARK OFFICE
CERTIFICATE OF CORRECTION

Page 1 of 1

PATENT NO. : 8,476,772 B2
APPLICATION NO. : 12/953812
DATED : July 2, 2013
INVENTOR(S) : Byung Tai Do et al.

It is certified that error appears in the above-identified patent and that said Letters Patent is hereby corrected as shown below:

On the Title Page, insert item (60):

--Related U.S. Application Data

Continuation-in-part of application No. 12/878,661, filed on Sep. 9, 2010, now Pat. No. 8,304,277.--

Signed and Sealed this
Seventeenth Day of June, 2014

Michelle K. Lee
*Deputy Director of the United States Patent and Trademark Office*